United States Patent
Murakata

Patent Number: 5,140,402
Date of Patent: Aug. 18, 1992

[54] AUTOMATIC PLACEMENT METHOD FOR ARRANGING LOGIC CELLS

[75] Inventor: Masami Murakata, Tokyo, Japan

[73] Assignee: Kabushiki Kaisha Toshiba, Kawasaki, Japan

[21] Appl. No.: 643,984

[22] Filed: Jan. 22, 1991

[30] Foreign Application Priority Data

Jan. 22, 1990 [JP] Japan .................................. 2-10666

[51] Int. Cl.⁵ .......................................... H01L 27/10
[52] U.S. Cl. ...................................... 357/45; 357/40; 364/491
[58] Field of Search ................... 364/491; 357/45, 40

[56] References Cited

U.S. PATENT DOCUMENTS 4,580,228  4/1986  Noto ..................................... 364/491
4,686,629  8/1987  Noto et al. ........................... 357/45

Primary Examiner—William Mintel
Assistant Examiner—Roy Potter
Attorney, Agent, or Firm—Foley & Lardner

[57] ABSTRACT

An automatic placement method for arranging logic cells on a chip, having a setting step for setting an evaluation function, target values thereof, placement improvement methods, and a range of a satisfaction level of each evaluation function, a calculating step for calculating a difference between a value of each evaluation function and, its target value, an improving step for selecting one of the placement improvement methods to optimize the evaluation function having the largest difference and then executing the placement improvement method; wherein the above processing is repeatedly executed over a required number of times, the range of each evaluation function is set by using probabilistic fluctuation each processing, and the range of each evaluation function is further narrowed with every processing.

4 Claims, 4 Drawing Sheets

THE NUMBER OF REPEATED ROUTING PROCESSES

THE NUMBER OF REPEATED ROUTING PROCESSES

AUTOMATIC PLACEMENT METHOD FOR ARRANGING LOGIC CELLS

BACKGROUND OF THE INVENTION

1. Field of the Invention

This invention relates to an automatic placement method by which logic cells are arranged efficiently on a semiconductor substrate.

2. Description of the Prior Art

FIG. 1 shows a schematic diagram of gate array formed on a semiconductor substrate such as a chip 61. In the same diagram, a plurality of basic cells 63 are arranged in matrix (a basic cell array) on the semiconductor chip 61. I/O cells 65 are placed around the basic cells 63.

Each basic cell 63 includes a predetermined number of transistors. Any logic circuit such as an inverter or a NAND circuit can be formed by wiring among the basic cells.

Many kinds of these logic circuits or logic cells (usually called macro cells), obtained by the method mentioned above, are stored in a library.

In order to make a LSI circuit, some required macro cells stored in the library are selected and placed automatically on the transistor array as the basic cell array arranged on the chip 61 so as to realize the LSI circuit having the required functions.

When the macro cells are arranged automatically on the transistor array, they are placed in rows.

Electrical wiring among the macro cells is executed automatically in the intervals between the rows. The interval is called by a channel region for the electrical wiring.

As described above, the width of the channel is determined by the size of the chip 61. Accordingly, in the layout design for an LSI, it is most important to reduce the number of unrouted nets.

Accordingly, in an automatic placement procedure of the layout design for the macro cells, the wirable macro cell placements having the smallest number of unrouted nets should be determined when an automatic wiring operation is carried out as a following step.

There are some conventional methods for determining the wirable placement.

(1) K. H. khokhani and A. M. Patel, "The Chip Layout Problem-A Placement Procedure", Proc. 14th Design Automation Conference, 1977, pp. 291-297.

(2) A. M. Patel, "A WIRABILITY PLACEMENT ALGORITHM FOR HIERARCHICAL VLSI LAYOUT", Proc IEEE 1984, pp. 344-350.

(3) H. Shiraishi and F. Hirose, "Efficient Placement and Routing Technique for master Slice LSI", Proc. 17th Design Automation Conference, 1980, pp. 458-464.

By these methods, the distribution of electrical wiring is uniform over the entire chip 61, so as to determine wire. Namely, it is determined by the method in which the wiring routes per net (per macro cell), in the layout design of the electrical wiring to be formed on the chip 61, are so predicted that the total capacity of the predicted layout is kept within the predetermined wiring capacity on the chip 61.

For predicting the wiring routes, the Steiner-tree model is used in cited conventional networks (1) and (2). These authors say that the Steiner-tree model reflects an actual wiring layout with the most efficiency of any in the prior art. However, it takes considerable time to obtain the resultant wiring layout by using that model. Namely, when the methods (1) and (2) described above are used for obtaining wiring layouts, considerable time is required.

In addition, these authors, above mentioned, acknowledge that it is difficult to obtain the required wiring layout reflecting the actual wiring layout because only the wiring length on the chip is considered in these methods.

On the other hand, the following work describes a wirable placement that can be obtained by the uniform, distribution of connecting terminals over the chip. See

[4] K. Klein., et al., "A study on Bipolar VLSI Gate-Array Assuming Four Layers of Metal", IEEE. J. of Solid-State Circuits, vol. sc-17, No. 3, Jun. 1982, pp 472-480.

In this method, a correlation between the distribution of the electric wiring and the connecting terminals is considered. A problem from crowded local wiring can be solved by the method. However, this method does not apply sufficiently to a distribution of electrical wiring having a wide or global area.

As described above, in order to obtain a wirable placement within a short time, evaluation functions for the global wiring state, and the local wiring state, and a procedure for efficiently evaluating relationships among these functions, is required. Moreover, a method to efficiently optimize these functions is also required. Because the evaluated functions, such as the distributions of the wiring and connecting terminals described above are not adequate it is not always possible to obtain an optimizing wirable placement within a short time.

There are methods to optimize the relationship among these evaluation functions, for example, those described in work (2).

In work (2), the method to optimize the relationship between the wiring length and the locally crowded wiring is used. On the other hand, it is common to use this method to minimize a difference between each evaluate function and a target value thereof which is preliminarily set per evaluate function.

In the method for optimizing two evaluate functions, the optimizing operation is performed in a predetermined order. Namely, one evaluate function can not be evaluated while the other evaluate function is optimized.

The method for minimizing the difference between the evaluate function and the target thereof cannot obtain the most optimized value (a reoptimized value) because in this method the values of a satisfaction level is set to a predetermined constant value.

In conventional methods, as described above, optimizing operations are performed in order to obtain the wirable placement by using the evaluate functions. However, one cannot fully satisfy the values of the evaluation functions.

SUMMARY OF THE INVENTION

An object of the present invention is to provide an automatic placement method for arranging logic cells, by which the most suitable wirable placement can be obtained with a short time by using plural evaluation functions equally optimized for evaluating a distribution of the logic cells arranged on a chip.

An automatic placement method for arranging logic cells on a semiconductor substrate, such as a chip according to the present invention, comprises a setting step for setting one or more evaluation functions, a target value for each evaluation functions, placement improvement methods, and a range of a satisfaction level of each evaluation function, a calculating step for calculating a difference between a value of each evaluation function by which a current placement state for the logic cells is evaluated and a target value of each evaluation function, an improving step for selecting one of the placement improvement methods in order to optimize the evaluation function having the largest difference and then executing the placement improvement method as a current improvement method in order to re-arrange the current placement state of the logic cells to a new placement state, a deciding step for deciding whether the value of the evaluation function having the largest difference according to the current placement improvement method is close to the target value of the evaluation function or not and a value of each evaluation function other than the evaluation function having the largest difference is kept in the range of the satisfaction level thereof or not, respectively, a resetting step for storing the current placement state of the logic cells into a predetermined store means, further limiting the range of the range of the satisfaction level according to each evaluation function in a smaller range, and calculating a difference between the value of each evaluation function by which the current placement state of the logic cells has been evaluated and the target value of each evaluation function when the value of the evaluation function having the largest difference is decreased and the values of the evaluation functions other than the evaluation function having the largest difference are kept in the ranges of the satisfaction levels thereof or the result obtained by the deciding step is satisfied, and an excluding step for changing the current placement state of the logic cells to the preceding placement state, and excluding the current placement improvement method in the next operation when the value of the evaluation function having the largest difference is not decreased and the values of at least an evaluation function other than the evaluation function having the largest difference is not kept in the range of the satisfaction level thereof or the result obtained by the deciding step is not satisfied, wherein a processing as the improving step, the deciding step, the re-setting step, and the excluding step is repeatedly executed required times, the range of each evaluation function is set by using probabilistic fluctuations for each processing, and the range of each evaluation function is further tightened for every processing.

One can obtain the most suitable placement of the logic cells on the chip with a short time by means of the automatic placement method for arranging logic cells according to the present invention.

These and other objects, feature and advantages of the present invention will be more apparent from the following description of a preferred embodiment, taken in conjunction with the accompanying drawing.

DETAILED DESCRIPTION OF THE EMBODIMENTS

Figure 1:
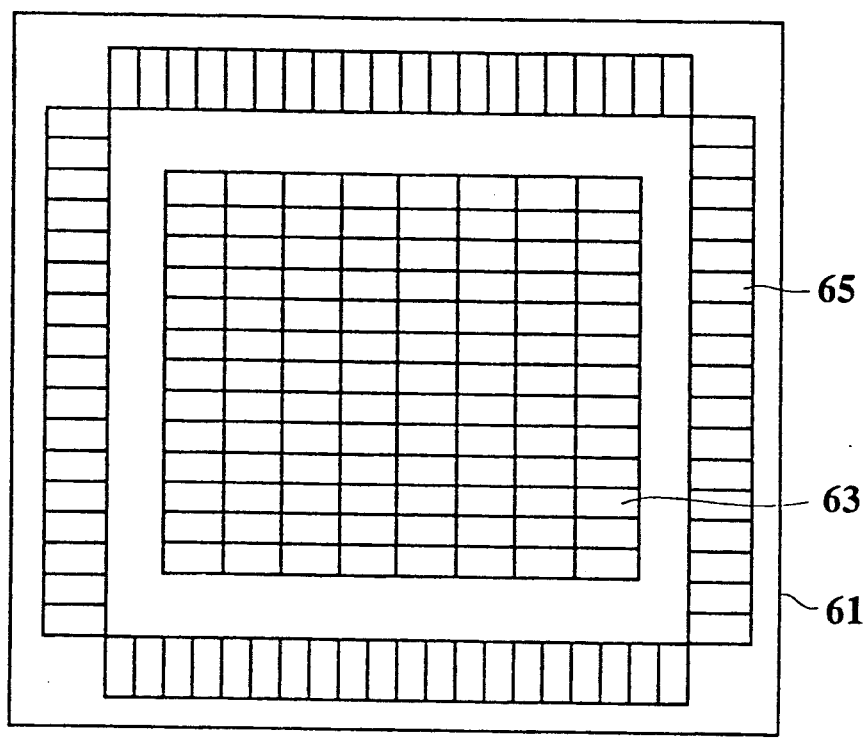
FIG. 1 is a schematic diagram of a placement of logic cells arranged on a semiconductor chip.

Hereinafter, preferred embodiments will now be explained referring to the drawings.

Figure 2:
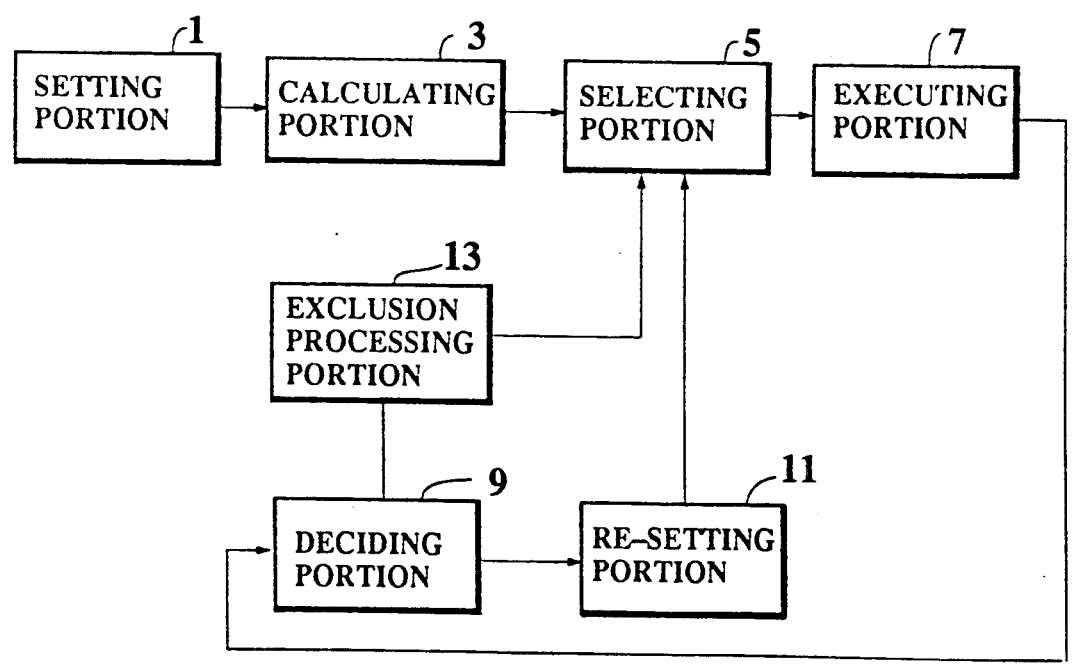
FIG. 2 is a block diagram of a logic cell placement device executing an automatic placement method for arranging logic cells according to the present invention.

FIG. 2 is a block diagram showing the construction of a logic cell placement device of an embodiment according to the present invention.

In the same diagram, evaluation functions for evaluating a current placement state of logic cells arranged on a chip, target values of the evaluation functions, placement improvement methods for optimizing the evaluation functions, and a range of satisfaction level of each evaluation function are set preliminarily in a setting portion 1.

The allowable range of the satisfaction level, as described below, is gradually tightened in accordance with the number of repeated operations.

In addition, the range of each satisfaction level is determined by every operation taking it's probabilistic perturbation value into account.

In a calculating portion 3, a difference between the each evaluation function for evaluating the current placement state in which a plural logic cells are arranged and a target value of each evaluation function is calculated. Moreover, in order to obtain the degree of importance ($D_i$) of each evaluation function, the difference is multiplied by a selection coefficient of each evaluation function in the calculating portion 3. The selection coefficient for an evaluation function means the degree of importance $D_i$ of the evaluation function in all evaluate functions.

In a selecting portion 5, a placement improvement method, so as to optimize the evaluation function having the largest $D_i$ of all $D_i$'s calculated by the calculating portion 3, is selected.

In an executing portion 7, the placement improvement method selected by the selecting portion 5 is executed, so as to to improve placement of the logic cells on the semiconductor chip 61.

In a deciding portion 9, it is decided whether the value of the evaluation function having the largest difference is decreased or not. Values of the evaluation functions other than the evaluation function having the largest difference are kept in the ranges of the satisfaction level thereof, or not.

When a decrease in the value of the evaluation function having the largest difference is noted by the deciding portion 9, and the values of another evaluation functions are kept in the range of their satisfaction levels, the improved placement as the current placement of the logic cells obtained by the processes described above is stored in a predetermined store means, such as a memory. Moreover, the re-setting portion 11 evaluates all of the evaluation functions again. Then, an improved new Di is calculated, by using the values of their evaluation functions, their target values, and their selection coefficients.

In addition, the range of the satisfaction level of each evaluation function is further tightened beyond that of the preceding operation by the re-setting portion 11. Then, in the next processing, the improved new Di is used in the selecting portion 5.

In an exclusion processing portion 13, when a decrease in the value of the evaluation function having the largest difference is not noted by the deciding portion 9 or the values of other evaluation functions are not kept in the range of their satisfaction level, the current placement state existing is changed to the placement state just before the current placement improvement method was executed. Moreover, the placement improvement method used in the current processing is not eliminated from a group of placement improvement methods, so as to be selected in next operation.

The setting process for setting the range of satisfaction levels used in the setting portion 1 and the re-setting portion 11 will now be explained.

The satisfaction level having a probabilistic perturbation value decided by using random numbers is obtained from the following equations:

$$fsf(i) = fsi + fsa(i) + fsp(i) \quad (1)$$

$$fsa(i) = (fsi^*p)/(q+1) \quad (2)$$

$$fsp(i) = fsa(i)/k^*(a, b) \quad (3)$$

Where, fsi is the intended satisfaction level for each evaluation function, fsa(i) is the value introduced to determine the probabilistic perturbation value, p, q, and k are constants, and i is the number of process iterations. The expression (a, b) indicates a random number between a and b.

Figure 3:
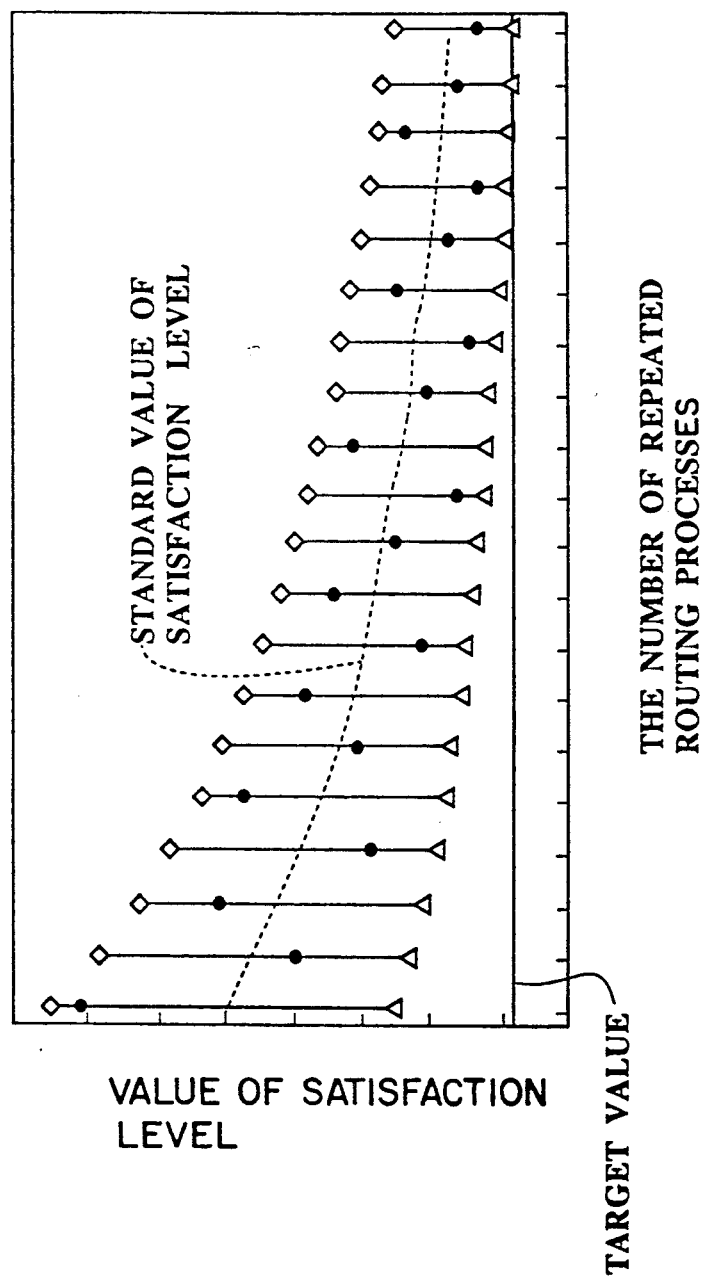
FIG. 3 illustrates the relationship between the number of repeated processes and changes of a range of satisfaction levels of an evaluation function used in the automatic placement method for logic cells executed by the logic cell placement device as shown in FIG. 2.

FIG. 3 shows the change of the satisfaction level based on the number of repeated processes for an evaluation function.

In the same diagram, the vertical line designates the change in the value of the satisfaction level, and the horizontal line denotes the number of iterations for a placement improvement method.

The dotted line indicates a reference value of the satisfaction level for the placement improvement process.

Each solid line intersecting the dotted line indicates a range of the satisfaction level determined every repeated processing by the re-setting portion 11.

The horizontal line drawn below the diagram shows the target value of the satisfaction level of the evaluation function.

When a placement improvement process is actually executed, one of the values, which is generated by random numbers in the range of the satisfaction level per operation is selected.

Thereby, the satisfaction level can include the probabilistic perturbation value.

Moreover, as shown in FIG. 3, the range of the satisfaction level is gradually tightened at every placement improvement operation.

If the value of the satisfaction level is fixed, as shown by the dotted line in the same diagram, succeeding processes are not executed after the value of the evaluation function is larger than it's satisfaction level. Namely, only the local optimum value is obtained.

On the other hand, when the probabilistic perturbation is considered in a placement improvement process such as in the present invention, even if a value of the evaluation function obtained by the preliminary optimizing process is larger than it's satisfaction level, as shown by the dotted line in FIG. 3, the optimization process can be continued.

Therefore a better placement for the logic cells may be obtained by the next optimization process, so that the global optimizing result can be obtained.

The logic cell placement device according to the present embodiment, is constructed as described above.

Figure 4:
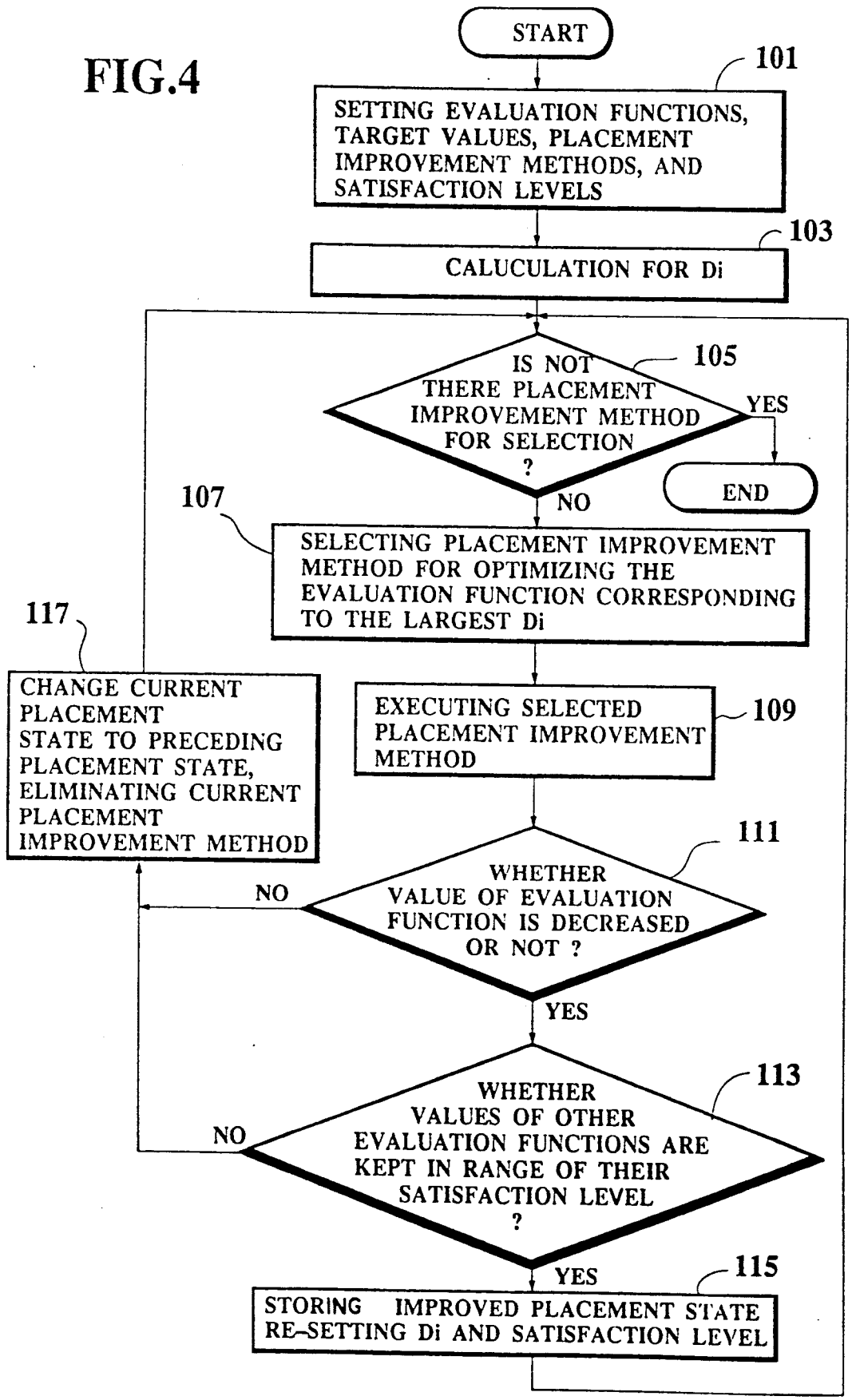
FIG. 4 is a flow chart to explain the operation of the automatic placement method for arranging logic cells according to the present invention.

Next, is explained the operation of the logic cell placement device in which four evaluation functions, a pin location, an overlap of logic cells, a distribution of cut, and the number of cuts, are used with referring FIG. 4. The number of cuts is defined by the number of wirings over a set of horizontal and vertical hypothetical lines.

First, in the setting portion 1, the evaluation functions, the target values of the evaluation functions, the placement improvement methods for the evaluation functions, and the satisfaction levels of the evaluation functions are preliminarily set.

In this embodiment, the four evaluate functions, the pin location, the overlap cells (which are local evaluate functions), the distribution of cut, and the number of cuts (which are global evaluate functions), are set (see step 101 shown in FIG. 4).

In the calculating portion 3, the values of the four evaluation functions based on the state in which many logic cells are placed on a chip are calculating by a predetermined procedure.

Moreover, differences between the values of the evaluation functions and the target values thereof are obtained in this portion 3. The Di of each evaluation function is obtained by a calculation that each difference is applied by each selection coefficient. Thereby, the degree of importance among the four evaluation functions is determined. Namely, the selecting order among the four evaluation functions is decided (see step 103 shown in FIG. 4).

When no placement improvement method is selected in the step 103 in the predetermined store means, for example, a memory keeps many placement improvement methods. The automatic placement method of the embodiment is completed. When the method is in such the store means, the procedure of the selecting portion 5 is executed (see step 105, shown in FIG. 4).

In the selecting portion 5, the placement improvement method for optimizing the evaluation function having the largest Di in the calculated Di is selected (see step 107 shown in FIG. 4).

In the executing portion 7, the selected method is executed (see step 109 shown in FIG. 4).

It is decided by the deciding portion 9 whether the value of the evaluation function is decreased or not after execution of the placement improvement method is finished (see step 111 shown in FIG. 4).

When the value is decreased, it is decided whether the values of other evaluation functions are kept in the satisfaction level thereof or not (see step 113 shown in FIG. 4).

When all values are kept within the ranges of the satisfaction levels, the following processes are performed by the re-setting portion 11:

The improved new placement state is kept in a predetermined store means.

The new Di's which are re-calculated by using values of the four evaluation functions (which are evaluated again based on the improved placement state), new target values of them, and new satisfaction levels of them (see step 115 shown in FIG. 4).

The placement improvement operation is repeated by using the new Di and the new satisfaction levels for the four evaluation functions.

On the other hand, when it is decided by the deciding operation at the deciding portion 9 that the value of the evaluation function is not decreased or is not kept in the range of the satisfaction level (see the reference characters "N" of steps 111 and 113 shown in FIG. 4), the current placement state is deleted and the preceding placement state of the logic cells is selected by the exclusion processing portion 13. Moreover, the current placement improvement method is eliminated in the next operation (see step 117 shown in FIG. 4).

Then, the placement improvement procedure is executed repeatedly by using the remained three evaluation functions.

As described above, the procedure of the steps 105 to 117 is repeatedly executed until the most improvement placement is obtained.

Figure 5:
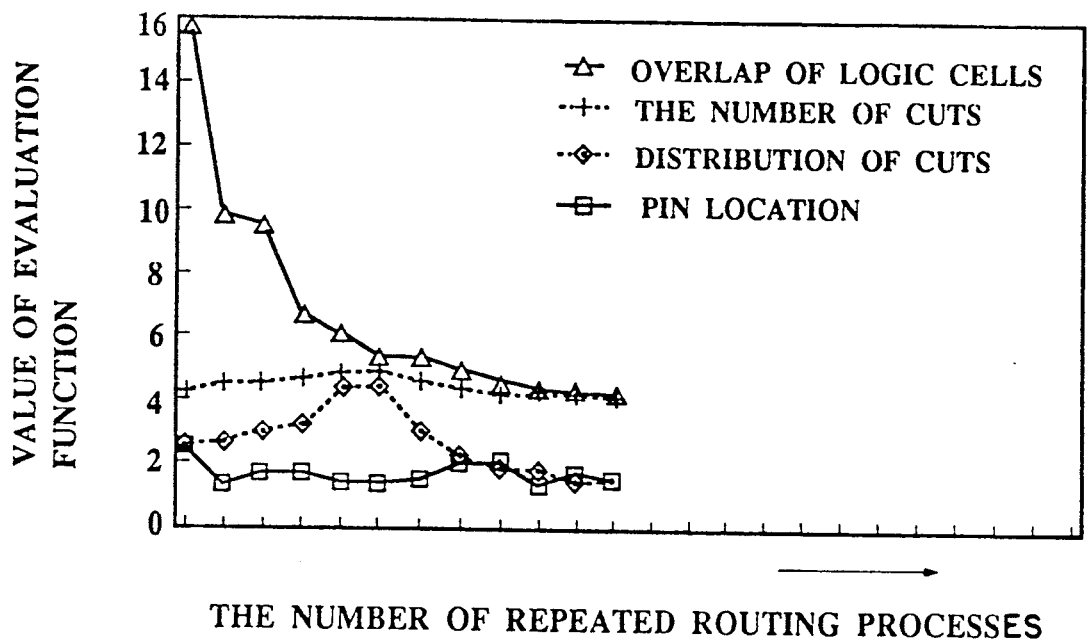
FIG. 5 shows the relationship between changes of each evaluation function and the number of repeated processes, when an automatic placement method for arranging logic cells according to the present invention is executed.

FIG. 5 shows a relationship between changes of each evaluation function and the number of repeated processes when an automatic placement method for logic cells according to the present invention is selected.

In the same diagram, data having 855 logic cells, 784 nets, a 15 k byte chip, and a gate availavility of 52.4% are used. The small solid line means the changes of the overlap of logic cells as the local evaluation function. The dotted line designates the change of the number of the cuts as the global evaluation function. The small dotted line denotes the changes of the distribution of cuts as the global evaluation function. The solid line is the pin location as the local evaluation function.

Figure 6:
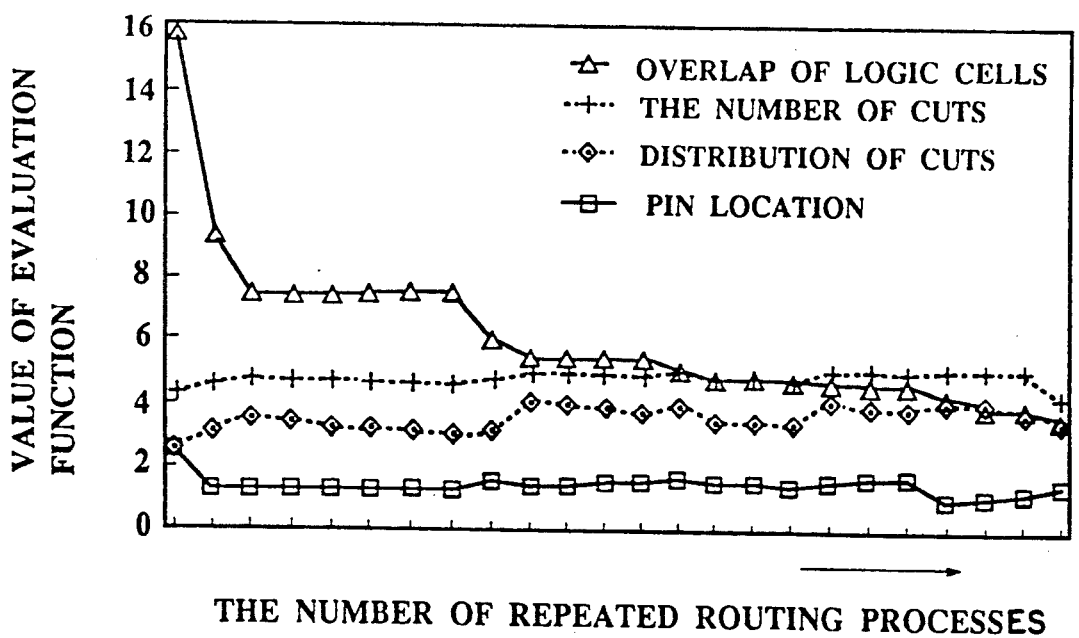
FIG. 6 shows the relationship between changes of each evaluation function and the number of repeated processes when a conventional automatic placement method for arranging logic cells is executed.

FIG. 6 shows the relationship between changes of each evaluation function and the number of repeated processes when a conventional automatic placement method for logic cells is executed.

As shown in FIG. 6, in the prior art not using the satisfaction level for each evaluation function, the value of each evaluation function is vibrated in accordance with the progress of the processing as the placement improvement operation, so that it takes a great deal of time for each evaluation function to converge to a required level. Moreover, each evaluation function can not reach to the target value thereof.

On the other hand, in the embodiment according to the present invention as shown in FIG. 5, vibrations of the four evaluation functions do not occur. Moreover, the values of the evaluation functions can be converged in less time than in the case of the conventional placement method as shown in FIG. 6.

As described above in detail, the four evaluation functions such as the overlap of logic cells, the number of cuts, the distribution of cuts, and the pin location are used. However, this invention is not limited to the embodiments described above. For example, a wiring length, and a distribution of the logic cell's sizes may be used as evaluation functions.

Various modifications will become possible for those skilled in the art after the teaching of the present disclosure without departing from the scope thereof.

What is claimed is:

1. An automatic placement method for arranging logic cells on a semiconductor substrate such as a chip, comprising:

a setting step for setting at least one evaluation function, a target value for each evaluation function, placement improvement methods for optimizing each evaluation function, and a range of a satisfaction level of each evaluation function;

a calculating step for calculating a difference between a value of each evaluation function by which a current placement state of the logic cells is evaluated and a target value of each evaluation function;

an improving step for selecting one of the placement improvement methods in order to optimize the evaluation function having the largest difference and then executing the placement improvement method as a current improvement method in order to re-arrange the current placement state of the logic cells into a new placement state;

a deciding step for deciding whether the value of the evaluation function having the largest difference according to the current placement improvement method is close to the target value of the evaluation function, and if a value of each evaluation function other than the evaluation function having the largest difference is being kept in the range of the satisfaction level thereof, respectively;

a re-setting step for storing the current placement state of the logic cells into a predetermined store means, further limiting the range of the satisfaction level according to each evaluation function into a smaller range, and calculating a difference between the value of each evaluation function by which the current placement state of the logic cells has been evaluated and the target value of each evaluation function when one of two conditions comprising a first condition that the value of the evaluation function having the largest difference is decreased and the values of the evaluation functions other than the evaluation function having the largest difference are kept in the ranges of the satisfaction levels thereof, and a second condition that the result obtained by the deciding step being satisfied, is met; and an excluding step for changing the current placement state of the logic cells to the preceding placement state, and excluding the current placement improvement method in the next operation when one of two conditions comprising a first condition that the value of the evaluation function having the largest difference is not decreased and the values of at least an evaluation function other than the evaluation function having the largest difference is not kept in the range of the satisfaction level thereof, and a second condition that the result obtained by the deciding step being not satisfied is met, wherein processing comprising the improving step, the deciding step, the re-setting step, and the excluding step is repeatedly executed a required number of times, the range of each evaluation function being set by using probabilistic fluctuation at each processing, and the range of each evaluation function further reduced by every processing.

2. An automatic placement method according to claim 1, wherein at each processing a weight for each evaluation function is set in the calculating step and the re-setting step, and the difference between the value of each evaluation function and the target value thereof is then calculated by using the weight.

3. An automatic placement method according to claim 1, wherein the range of the satisfaction level for each evaluation function is obtained by the probabilistic fluctuation equations:

$$fsf(i) = fsi + fsa(i) + fsp(i)$$

$$fsa(i) = (fsi*p)/(q+1)$$

$$fsp(i) = fsa(i)/k*(a,b)$$

where, fsf(i) is a value of a satisfaction level according to i-th evaluation function at 1-th placement improvement process, fsp(i) is a range of a satisfaction level at i-th placement improvement process, fsi is an intended satisfaction level for each evaluation function, fsa(i) is the value introduced to determine the probabilistic perturbation value, p, g, and k are constants, i is the number of process iterations, and (a,b) is a random number between a and b.

4. An automatic placement device for automatically arranging logic cells on a semiconductor substrate such as a chip, comprising:
 a setting means for setting at least one evaluation function, a target value of each evaluation function, placement improvement methods for optimizing each evaluation function, and a range of a satisfaction level of each evaluation function;
 a calculating means for calculating a difference between a value of each evaluation function by which a current placement state of the logic cells is evaluated and a target value of each evaluation function;
 an improving means for selecting one of the placement improvement methods in order to optimize the evaluation function having the largest difference and then executing the placement improvement method as a current improvement method in order to re-arrange the current placement state of the logic cells to a new placement state;
 a deciding means for deciding whether the value of the evaluation function having the largest difference according to the current placement improvement method is close to the target value of the evaluation function, and a value of each evaluation function other than the evaluation function having the largest difference being kept in the range of the satisfaction level thereof, respectively;
 a re-setting means for storing the current placement state of the logic cells into a predetermined store means, further limiting the range of the satisfaction level according to each evaluation function in a smaller range, and calculating a difference between the value of each evaluation function by which the current placement state of the logic cells has been evaluated and the target value of each evaluation function when one of two conditions comprising a first condition that the value of the evaluation function having the largest difference is decreased and the values of the evaluation functions other than the evaluation function having the largest difference are kept in the ranges of the satisfaction levels thereof, and a second condition that the result obtained by the deciding step being satisfied, is met; and
 an excluding means for changing the current placement state of the logic cells to the preceding placement state, and excluding the current placement improvement method in the next operation when one of two conditions comprising a first condition that the value of the evaluation function having the largest difference is not decreased and the values of at least an evaluation function other than the evaluation function having the largest difference is not kept in the range of the satisfaction level thereof, and a second condition that the result obtained by the deciding step being not satisfied is met,
 wherein a processing carried out by the improving means, the deciding means, the re-setting means, and the excluding means is repeatedly executed a required number of times, the range of each evaluation function being set by using probabilistic fluctuation at each processing, and the range of each evaluation function further limited by every processing.

* * * * *